US010157741B1

(12) United States Patent
Lee et al.

(10) Patent No.: US 10,157,741 B1
(45) Date of Patent: Dec. 18, 2018

(54) METHOD OF MANUFACTURING A SEMICONDUCTOR STRUCTURE

(71) Applicant: TAIWAN SEMICONDUCTOR MANUFACTURING COMPANY LTD., Hsinchu (TW)

(72) Inventors: Yung-Yao Lee, Hsinchu County (TW); En-Chao Shen, Hsinchu (TW)

(73) Assignee: TAIWAN SEMICONDUCTOR MANUFACTURING COMPANY LTD., Hsinchu (TW)

( * ) Notice: Subject to any disclaimer, the term of this patent is extended or adjusted under 35 U.S.C. 154(b) by 24 days.

(21) Appl. No.: 15/664,531

(22) Filed: Jul. 31, 2017

(51) Int. Cl.
*H01L 21/67* (2006.01)
*G06F 17/00* (2006.01)
*H01L 21/027* (2006.01)
*G03F 7/20* (2006.01)

(52) U.S. Cl.
CPC ........ *H01L 21/0274* (2013.01); *G03F 7/2004* (2013.01)

(58) Field of Classification Search
CPC ...... G03F 7/70991; G05B 2219/45031; H01L 21/67115; H01L 21/67276; H01L 21/67763; H01L 21/67736; H01L 21/67778

USPC ......................................................... 700/214
See application file for complete search history.

(56) References Cited

U.S. PATENT DOCUMENTS

| 2006/0223334 | A1* | 10/2006 | Saki | ................ | G05B 19/41865 |
| | | | | | 438/765 |
| 2008/0051930 | A1* | 2/2008 | Oh | .................... | H01L 21/67276 |
| | | | | | 700/214 |
| 2015/0268560 | A1* | 9/2015 | Tada | .................. | G03F 7/70991 |
| | | | | | 355/67 |

* cited by examiner

*Primary Examiner* — Jasmine Clark
(74) *Attorney, Agent, or Firm* — WPAT, P.C., Intellectual Property Attorneys; Anthony King

(57) ABSTRACT

A method of manufacturing a semiconductor structure includes providing a first lot including a plurality of first wafers and a second lot including a plurality of second wafers; deriving a first processing time for processing the first lot; deriving a second processing time for processing the second lot; deriving a processing time difference between the first processing time and the second processing time; loading a first mask on a mask stage; processing the first lot on a wafer stage; removing the first mask from the mask stage; loading a second mask on the mask stage; and processing the second lot on the wafer stage, wherein a time interval between accomplishment of the processing of the first lot and beginning of the processing of the second lot is substantially greater than or equal to the processing time difference.

20 Claims, 14 Drawing Sheets

METHOD OF MANUFACTURING A SEMICONDUCTOR STRUCTURE

BACKGROUND

Electronic equipments using semiconductor devices are essential for many modern applications. With the advancement of electronic technology, the semiconductor devices are becoming increasingly smaller in size while having greater functionality and greater amounts of integrated circuitry. Due to the miniaturized scale of the semiconductor device, a number of semiconductive components are assembled on the semiconductor device. Numerous manufacturing operations are implemented within such a small semiconductor device.

The manufacturing operations of the semiconductor device involve many steps and operations on such a small and thin semiconductor device. The manufacturing of the semiconductor device in a miniaturized scale becomes more complicated. An increase in a complexity of manufacturing the semiconductor device may cause deficiencies such as poor electrical interconnection, development of cracks, delamination of components or other issues, resulting in a high yield loss of the semiconductor device. The semiconductor device is produced in an undesired configuration, which would further exacerbate materials wastage and thus increase the manufacturing cost.

The semiconductor device is assembled with numbers of integrated components. Since more different components are involved, a complexity of the manufacturing operations of the semiconductor device is increased. There is a continuous need to improve the manufacturing of the semiconductor device and solve deficiencies.

BRIEF DESCRIPTION OF THE DRAWINGS

Aspects of the present disclosure are best understood from the following detailed description when read with the accompanying figures. It is emphasized that, in accordance with the standard practice in the industry, various features are not drawn to scale. In fact, the dimensions of the various features may be arbitrarily increased or reduced for clarity of discussion.

DETAILED DESCRIPTION OF THE DISCLOSURE

Figure 1:
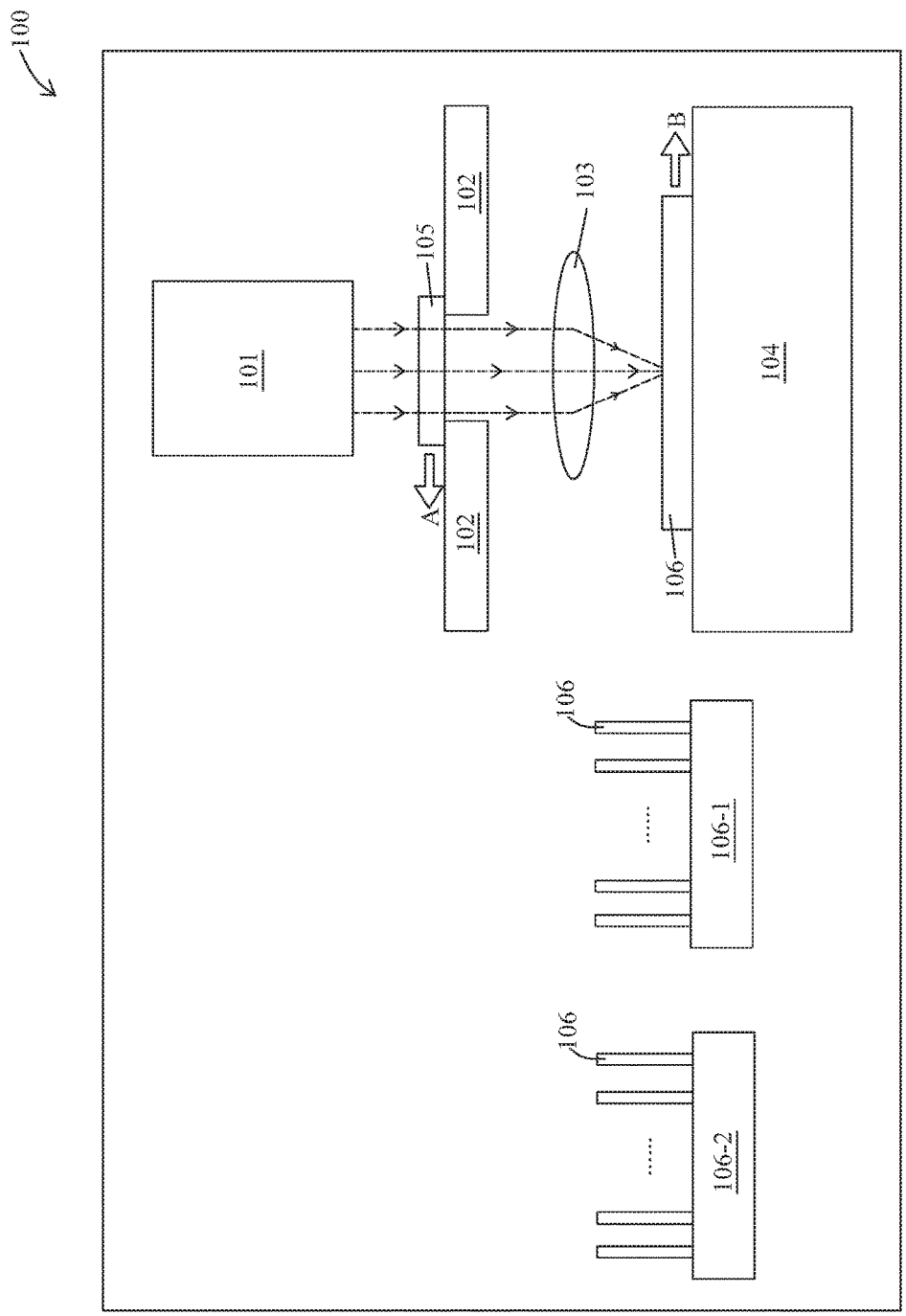
FIG. 1 is a schematic cross sectional view of a lithographic apparatus for manufacturing a semiconductor structure in accordance with some embodiments of the present disclosure.

The following disclosure provides many different embodiments, or examples, for implementing different features of the provided subject matter. Specific examples of components and arrangements are described below to simplify the present disclosure. These are, of course, merely examples and are not intended to be limiting. For example, the formation of a first feature over or on a second feature in the description that follows may include embodiments in which the first and second features are formed in direct contact, and may also include embodiments in which additional features may be formed between the first and second features, such that the first and second features may not be in direct contact. In addition, the present disclosure may repeat reference numerals and/or letters in the various examples. This repetition is for the purpose of simplicity and clarity and does not in itself dictate a relationship between the various embodiments and/or configurations discussed.

Further, spatially relative terms, such as "beneath," "below," "lower," "above," "upper" and the like, may be used herein for ease of description to describe one element or feature's relationship to another element(s) or feature(s) as illustrated in the figures. The spatially relative terms are intended to encompass different orientations of the device in use or operation in addition to the orientation depicted in the figures. The apparatus may be otherwise oriented (rotated 90 degrees or at other orientations) and the spatially relative descriptors used herein may likewise be interpreted accordingly.

A semiconductor structure is manufactured by a number of operations. During the manufacturing, a circuitry pattern is formed on a wafer or substrate by lithography operations. A mask or reticle is used to transfer the circuitry pattern on the wafer. The mask is loaded into a lithographic apparatus (e.g. stepper or scanner) and placed on a mask stage, and the wafer is loaded into the lithographic apparatus and placed on a wafer stage. The wafer is coated with a radiation sensitive material (e.g. photoresist), and a radiation beam is incident through the mask, focused by a lens and projected towards the radiation sensitive material to pattern the radiation sensitive material to become the circuitry pattern on the wafer. Several layers of the circuitry pattern are overlaid on the wafer to generate an integrated circuit (IC) die or chip.

However, the loading of the wafer and the loading of the mask are not properly controlled and not collaborative. For example, the substrate is loaded on the wafer stage and awaited for loading of the mask on the mask stage and processing of the lithography operations. Further, the lens and the mask are idle and cooled down undesirably upon waiting for the loading of the wafer or the loading of the mask. Such undesired cooling down of the lens and the mask would adversely affect a quality of the overlay of the circuitry pattern on the wafer. Poor overlay of the circuitry pattern would result in a poor electrical connection between components or conductive lines formed on the wafer. As a result, a reliability of the circuitry formed on the wafer would be decreased.

In the present disclosure, a method of manufacturing a semiconductor structure is disclosed. The method includes providing a first lot of wafers and a second lot of wafers, deriving a processing time difference for processing the first lot and processing the second lot, loading a first mask on a mask stage, processing the first lot, removing the first mask from the mask stage, loading a second mask on the mask stage and processing the second lot. A time interval between accomplishment of the processing of the first lot and beginning of the processing of the second lot is substantially greater than or equal to the processing time difference. The second mask is loaded on the mask stage before loading a first wafer of the second lot. The removal of the first mask and the loading of the second mask are correlated with the processing time difference. As such, a timing of removing the first mask and a timing of loading the second mask are derived before the processing of the first lot and the second lot. For example, a time interval between the removing of the first mask and the loading of the second mask and a time interval between the loading of the second mask and the loading of the second lot are determined based on the processing time difference before the processing of the first lot and the second lot. Therefore, the loading of the second mask and the loading of the second lot can be timely performed, despite of lot size difference between the first lot and the second lot. As such, a delay of the loading of the second mask and immature loading of the second lot can be minimized or prevented.

Further, the processing of wafers includes projecting a radiation beam through the mask towards the wafers. The radiation beam is focused by a lens and incident on the wafers. The mask and the lens would be heated during the processing of the wafers. Since the time interval between accomplishment of the processing of the first lot and beginning of the processing of the second lot is optimized by deriving the processing time difference, heating of the mask and the lens would be controlled and adjusted according to the processing time difference. As such, the mask and the lens would not be undesirably cooled down. Temperatures of the mask and the lens would be under control and adjusted based on the processing time difference. As such, a quality of the processing of the wafers can be increased or improved.

FIG. 1 is a schematic view of a lithographic apparatus 100 in accordance with various embodiments of the present disclosure. In some embodiments, the lithographic apparatus 100 includes an illuminator 101, a mask stage 102, a lens 103 and a wafer stage 104.

In some embodiments, the illuminator 101 is configured to irradiate a radiation beam (broken lines shown in FIG. 1). In some embodiments, the radiation beam is an electromagnetic radiation. In some embodiments, the radiation beam has a wavelength shorter than a wavelength of visible light. In some embodiments, the radiation beam is an ultraviolet (UV) light.

In some embodiments, the mask stage 102 is disposed under the illuminator 101. In some embodiments, the mask stage 102 is configured to support a mask 105 or the like. In some embodiments, the mask 105 is disposed on the mask stage 102. In some embodiments, the mask 105 is loaded on the mask stage 102 by a mask loader. In some embodiments, the mask loader loads the mask 105 from a mask rack to the mask stage 102.

In some embodiments, the mask 105 is a reticle or photomask. In some embodiments, the mask 105 is configured to impart the radiation beam in a predetermined pattern and generate the predetermined pattern on a substrate or a wafer 106 coated with a radiation sensitive material (e.g. photoresist). In some embodiments, the mask 105 includes a predetermined circuitry pattern, and the wafer is patterned with the predetermined circuitry pattern after projecting the radiation beam through the mask 105 on the wafer 106. In some embodiments, the mask 105 or the mask stage 102 is displaceable along a direction A (arrow as shown in FIG. 1).

In some embodiments, the lens 103 is disposed between the mask stage 102 and the wafer stage 104. In some embodiments, the radiation beam from the illuminator 101 is projected through the mask 105 and the lens 103 towards the wafer 106. In some embodiments, the lens 103 is configured to focus the radiation beam and reduce the predetermined circuitry pattern on the wafer 106. In some embodiments, the lens 103 is a convex lens.

In some embodiments, the wafer stage 104 is disposed under the lens 103. In some embodiments, the wafer stage 104 is configured to support the wafer 106 or the like. In some embodiments, the wafer 106 is disposed on the wafer stage 104. In some embodiments, the wafer 106 is loaded on the wafer stage 104 by a wafer loaded. In some embodiments, the wafer loader loads the wafer 106 from a wafer cassette to the wafer stage 104. In some embodiments, several lots of wafers (106-1, 106-2) are loaded into the apparatus 100. In some embodiments, each lot includes several wafers 106. In some embodiments, different lots of wafers (106-1, 106-2) have different number of wafers 106 or have different lot size. In some embodiments, the wafer 106 is loaded to the wafer stage 104 one by one from a wafer cassette to the wafer stage 104 for subsequent processing.

In some embodiments, the wafer 106 includes semiconductive material such as silicon, etc. In some embodiments, the wafer 106 is in a circular shape or any other suitable shapes. In some embodiments, the wafer 106 or the wafer stage 106 is displaceable along a direction B (arrow as shown in FIG. 1).

In some embodiments, the mask 105 is displaced along the direction A and the wafer 106 is displaced along the direction B opposite to the direction A upon generating the predetermined circuitry pattern on the wafer 106. The radiation beam is projected through the mask 105 and the lens 103 towards the wafer 106 when the mask 105 is moved along the direction A and the wafer 106 is moved along the direction B, such that the radiation sensitive material on the wafer 106 is patterned in the predetermined circuitry pattern. In some embodiments, the mask 105 is removed from the mask stage 102 and the wafer 106 is removed from the wafer stage 104 after the patterning of the predetermined circuitry pattern on the wafer 106.

Figure 2:
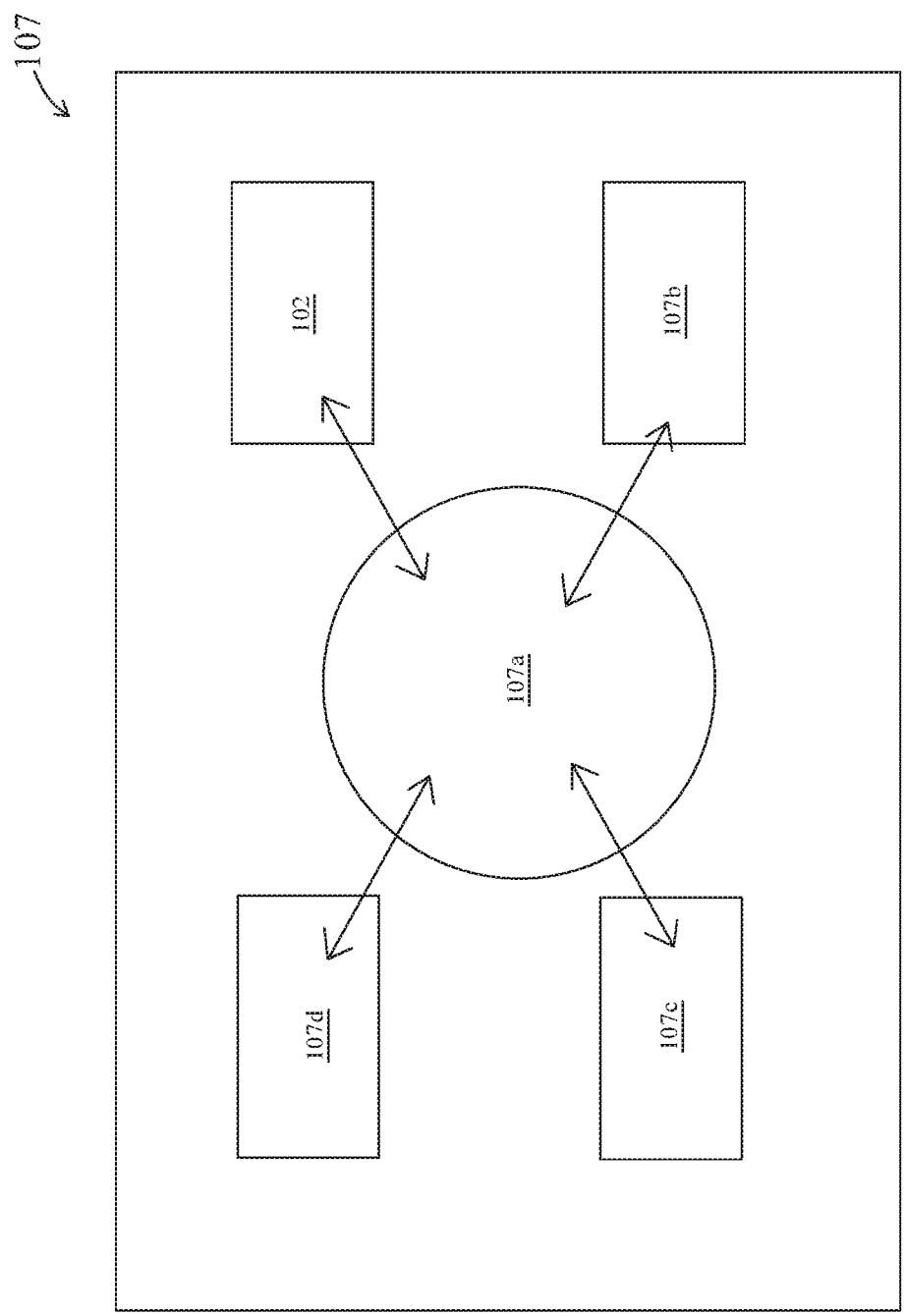
FIG. 2 is a schematic view of a transfer module configured to cooperate with the lithographic apparatus of FIG. 1.

FIG. 2 depicts a transfer module 107 configured to cooperate with the lithographic apparatus 100 in FIG. 1. In some embodiments, the transfer module 107 is configured to convey masks 105 into and out of the lithographic apparatus 100. The transfer module 107 has a robot 107a for handling masks 105. In some embodiments, one of masks 105 from a mask library 107b is conveyed by the robot 107a. In some embodiments, the mask library 107b is configured for storing various masks 105. In some embodiments, one of masks 105 is conveyed from the mask library 107b to a chamber 107c by the robot 107a. In some embodiments, the mask 105 in the chamber 107c is then loaded on the mask stage 102 of the lithographic apparatus 100 by the robot 107a. In some embodiments, the mask 105 is conveyed to a detector 107d by the robot 107a before loading into the lithographic apparatus 100. In some embodiments, the detector 107d is configured to check if the mask 105 to be loaded into the lithographic apparatus 100 has any defects or faults.

Figure 3:
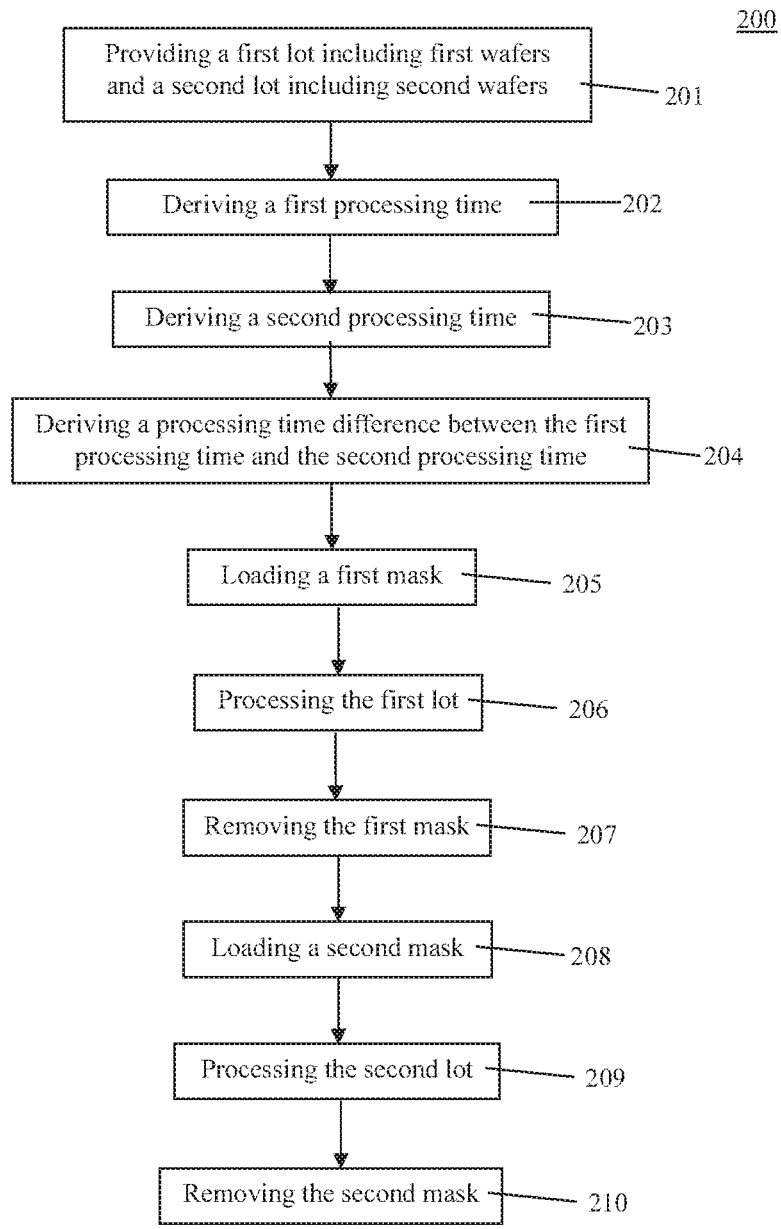
FIG. 3 is a flow diagram of a method of manufacturing a semiconductor structure in accordance with some embodiments of the present disclosure.
Figure 4:
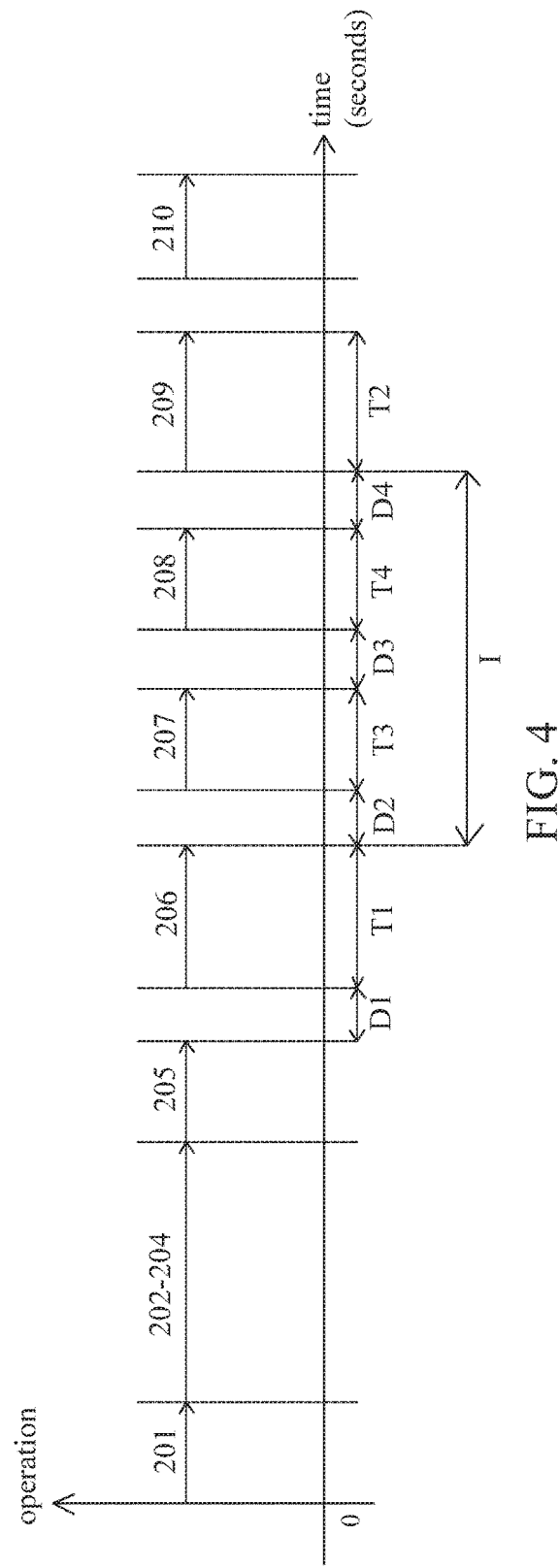
FIG. 4 is a timeline of implementing the method of FIG. 3.

FIG. 3 is a method 200 of manufacturing a semiconductor structure in accordance with various embodiments of the present disclosure, and FIG. 4 is a timeline of implementing the method 200. In some embodiments, the method 200 is implemented by the lithographic apparatus 100 as illustrated in FIG. 1. In some embodiments, the method 200 includes a number of operations and the description and illustration are not deemed as a limitation as the sequence of the operations. In some embodiments, the method 200 includes a number of operations (201, 202, 203, 204, 205, 206, 207, 208, 209 and 210).

Figure 5A:
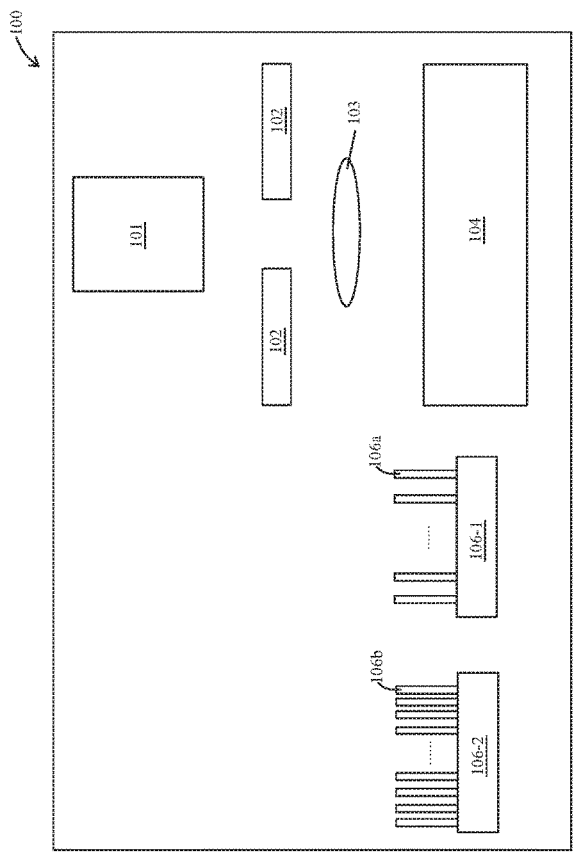
FIGS. 5A-5V are schematic views of manufacturing a semiconductor structure by the method of FIG. 3 and the timeline of FIG. 4 in accordance with some embodiments of the present disclosure.
Figure 5B:
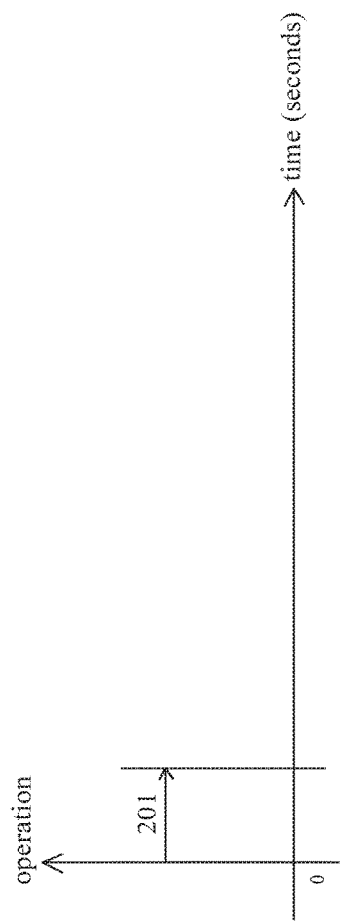

In operation 201, a first lot 106-1 including several first wafers 106a and a second lot 106-2 including several second wafers 106b are provided as shown in FIGS. 5A and 5B. In some embodiments as shown in FIG. 5A, the first lot 106-1 and the second lot 102-2 are loaded into a lithographic apparatus 100. In some embodiments, the first lot 106-1 and the second lot 102-2 are loaded from a wafer cassette into the lithographic apparatus 100 and awaited for subsequent processing. In some embodiments as shown in FIG. 5B, the first lot 106-1 and the second lot 106-2 take about a certain period of time for loading into the lithographic apparatus 100.

In some embodiments, the first wafer 106*a* has similar or different configuration as the second wafer 106*b*. In some embodiments, the first wafer 106*a* and the second wafer 106*b* include semiconductive material such as silicon, etc. In some embodiments, the first wafer 106*a* and the second wafer 106*b* are in a circular shape or any other suitable shapes. In some embodiments, the first wafer 106*a* and the second wafer 106*b* are coated with a radiation sensitive material such as photoresist. In some embodiments, the radiation sensitive material coats on the first wafer 106*a* and the second wafer 106*b* by spin coating or any other suitable operations.

In some embodiments, the first lot 106-1 and the second lot 106-2 are in different lot size. In some embodiments, a total number of first wafers 106*a* is different from a total number of second wafers 106*b*. In some embodiments, the first lot 106-1 has smaller lot size than the second lot 106-2. In some embodiments, a total number of first wafers 106*a* is substantially less than a total number of second wafers 106*b*.

Figure 5C:
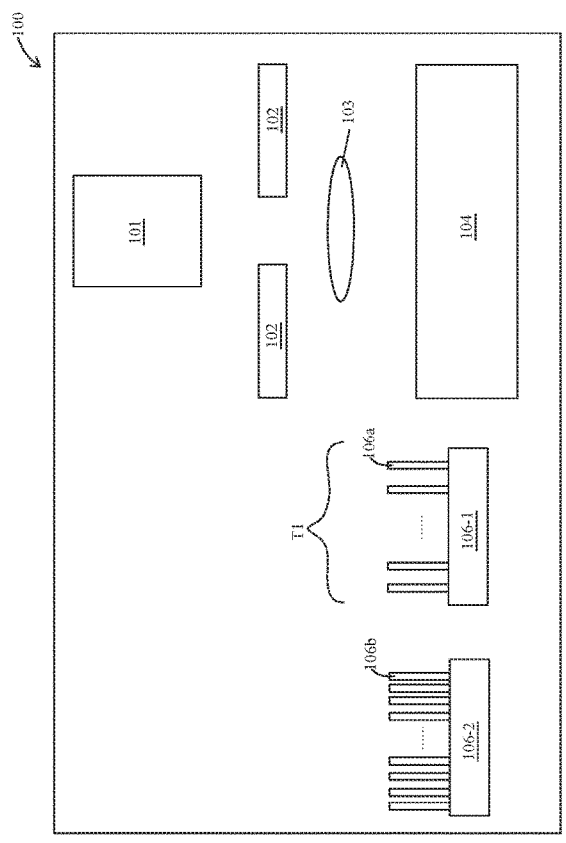
Figure 5D:
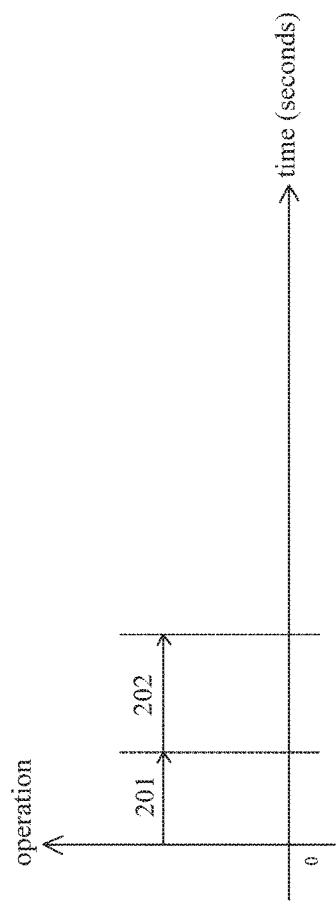

In operation 202, a first processing time T1 for processing the first lot 106-1 (subsequent operation 206) is derived as shown in FIGS. 5C and 5D. In some embodiments as shown in FIG. 5C, the first processing time T1 is derived after loading the first lot 106-1 into the lithographic apparatus 100. In some embodiments as shown in FIG. 5D, the deriving of the first processing time T1 takes about a certain period of time.

In some embodiments, the first processing time T1 is derived from the lot size or the total number of first wafers 106*a* in the first lot 106-1. In some embodiments, the first processing time T1 is proportional to the total number of first wafers 106*a* in the first lot 106-1. In some embodiments, the first processing time T1 equals a time for processing one of the first wafers 106*a* multiplied by the total number of first wafers 106*a* in the first lot 106-1.

Figure 5E:
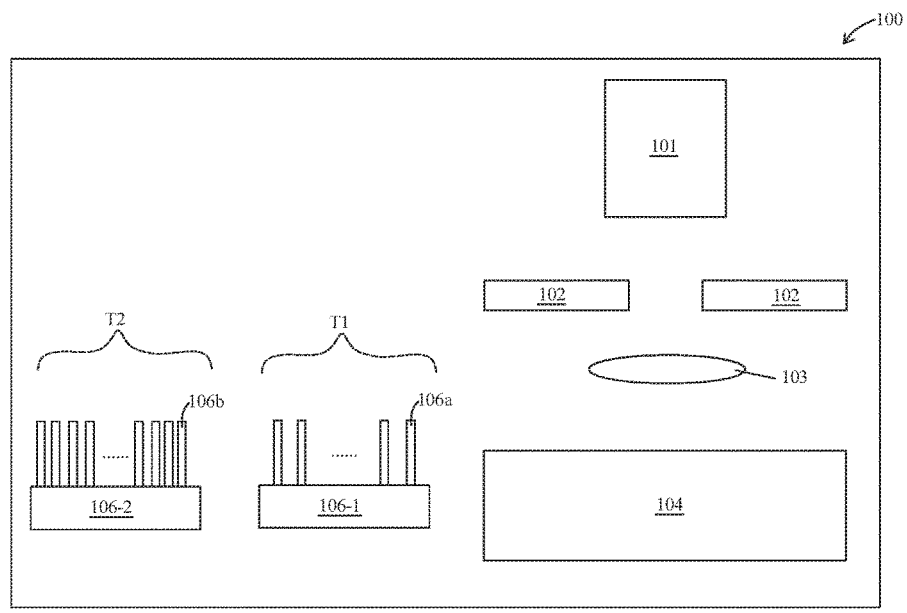
Figure 5F:
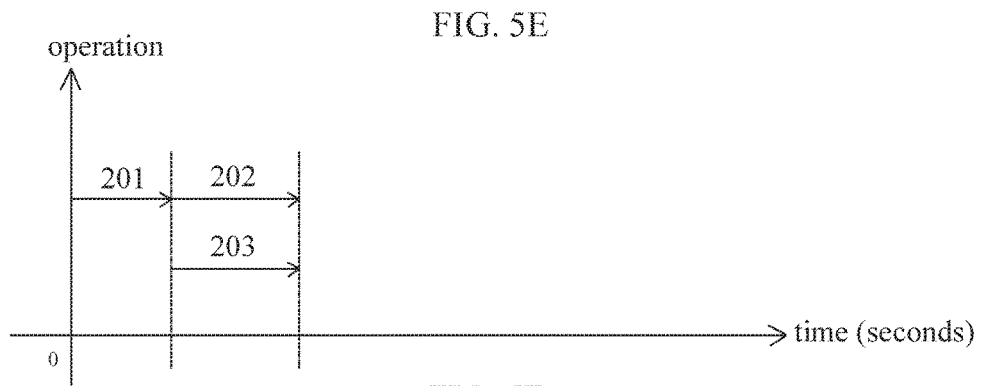
Figure 5G:
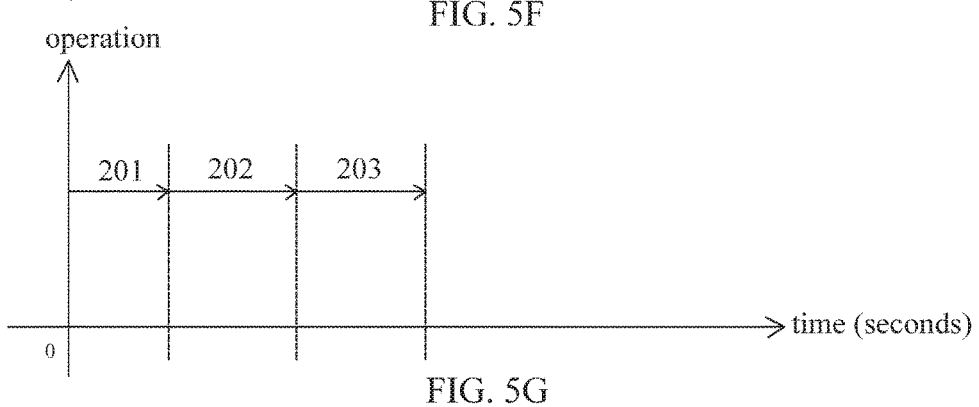

In operation 203, a second processing time T2 for processing the second lot 106-2 (subsequent operation 209) is derived as shown in FIGS. 5E-5G. In some embodiments as shown in FIG. 5E, the second processing time T2 is derived after loading the second lot 106-2 into the lithographic apparatus 100. In some embodiments as shown in FIGS. 5F and 5G, the deriving of the second processing time T2 takes about a certain period of time. In some embodiments as shown in FIG. 5F, the operation 202 and the operation 203 are performed simultaneously. In some embodiments as shown in FIG. 5G, the operation 203 is performed after the operation 202. In some embodiments, the operation 203 is performed before the operation 202. In some embodiments, the operation 202 and the operation 203 are performed before processing the first lot 106-1 (subsequent operation 206) or processing the second lot 106-2 (subsequent operation 209).

In some embodiments, the second processing time T2 is derived from the lot size or the total number of second wafers 106*b* in the second lot 106-2. In some embodiments, the second processing time T2 is proportional to the total number of second wafers 106*b* in the second lot 106-2. In some embodiments, the second processing time T2 equals a time for processing one of the second wafers 106*b* multiplied by the total number of second wafers 106*b* in the second lot 106-2. In some embodiments, the first processing time T1 is substantially shorter than the second processing time T2.

Figure 5H:
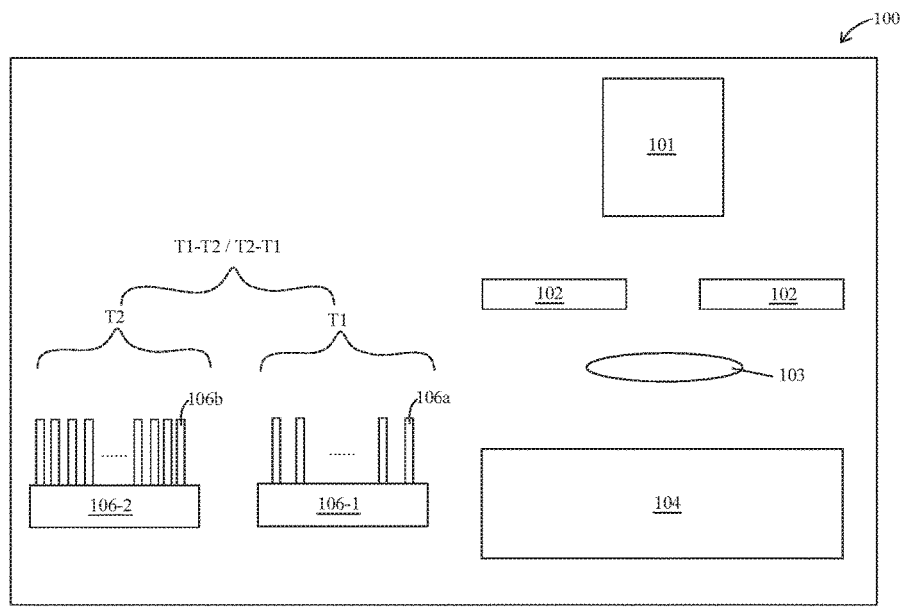
Figure 5I:
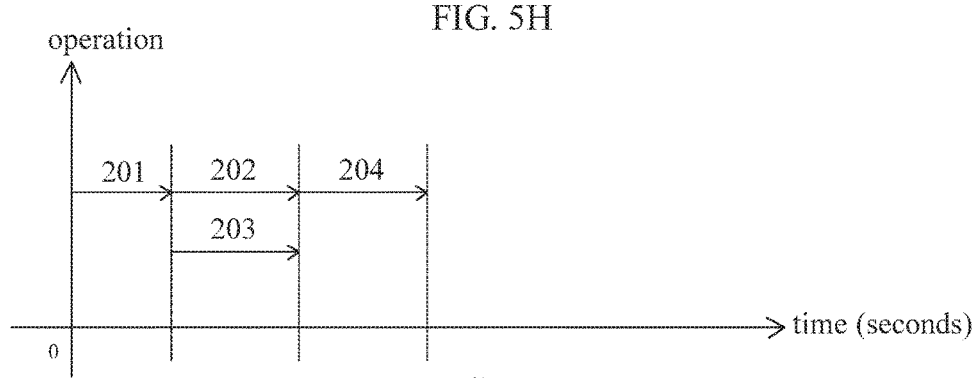
Figure 5J:
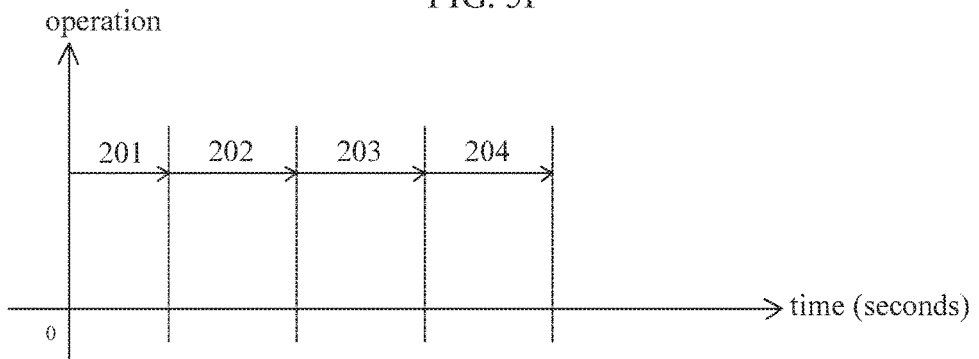

In operation 204, a processing time difference (T1–T2 or T2–T1) between the first processing time T1 and the second processing time T2 is derived as shown in FIGS. 5H-5J. In some embodiments as shown in FIG. 5H, the processing time difference (T1–T2 or T2–T1) is derived after the operation 202 and the operation 203. In some embodiments as shown in FIGS. 5I and 5J, the deriving of the processing time difference (T1–T2 or T2–T1) takes about a certain period of time.

In some embodiments as shown in FIG. 5I, the operation 204 is performed after the operation 202 and the operation 203. In some embodiments as shown in FIG. 5J, the operation 204 is performed after the operation 203, and the operation 203 is performed after the operation 202. In some embodiments, the operation 204 is performed after the operation 202, and the operation 202 is performed after the operation 203.

In some embodiments, the processing time difference (T1–T2 or T2–T1) is a time difference between the first processing time T1 and the second processing time T2. In some embodiments, the processing time difference is performed before processing the first lot 106-1 (subsequent operation 206) or processing the second lot 106-2 (subsequent operation 209).

In some embodiments, a time interval I (as shown in FIG. 4) between loading of a last wafer of the first lot 106-1 and loading a first wafer of the second lot 106-2 is derived before processing the first lot 106-1 (subsequent operation 206) or processing the second lot 106-2 (subsequent operation 209). In some embodiments, the time interval I is between accomplishment of the processing of the first lot 106-1 (subsequent operation 206) and beginning of the processing of the second lot 106-2 (subsequent operation 209). In some embodiments, the time interval I is derived from a difference between the total number of the first wafers 106*a* and the total number of the second wafers 106*b*. In some embodiments, removing of a first mask 105-1 (subsequent operation 205) and loading of a second mask 105-2 (subsequent operation 208) are performed within the time interval I. In some embodiments, the time interval I is substantially greater than or equal to the processing time difference (T1–T2 or T2–T1). In some embodiments, the time interval I is about 30 seconds to about 100 seconds.

Figure 5K:
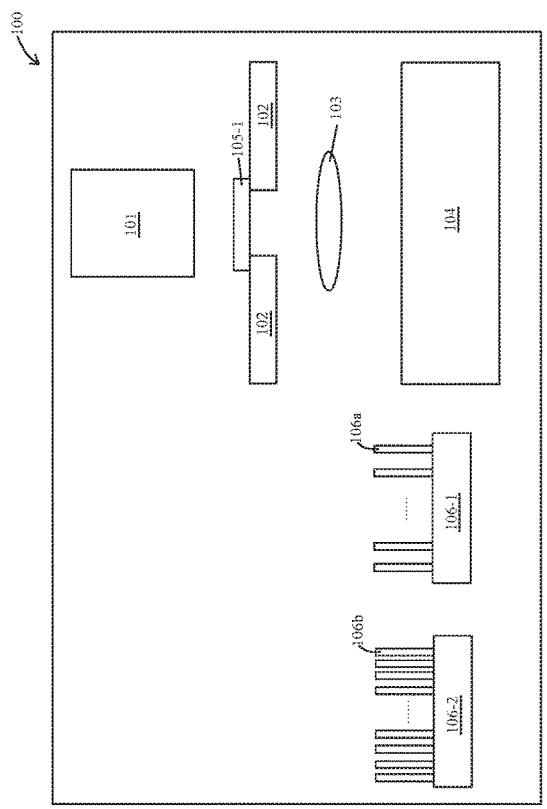
Figure 5L:
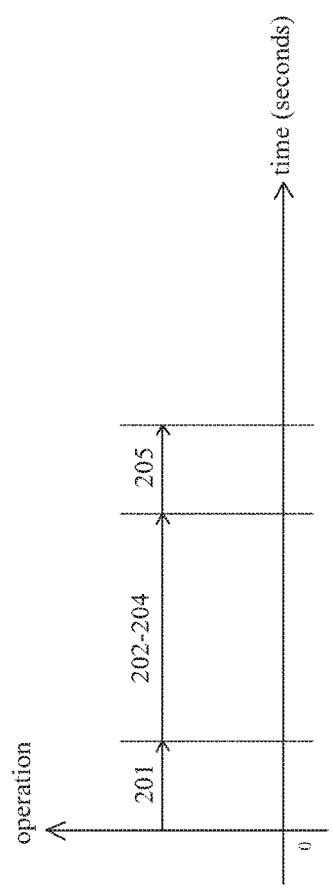

In operation 205, a first mask 105-1 is loaded on a mask stage 102 of the lithographic apparatus 100 as shown in FIGS. 5K and 5L. In some embodiments as shown in FIG. 5K, the first mask 105-1 is loaded to the mask stage 102 by a mask loader. In some embodiments, the mask loader loads the first mask 105-1 from a mask rack to the mask stage 102. In some embodiments, the first mask 105-1 is configured to impart a radiation beam in a predetermined pattern and generate the predetermined pattern on the first wafer 106-1 coated with a radiation sensitive material.

In some embodiments as shown in FIG. 5L, the loading of the first mask 105-1 takes about a certain period of time. In some embodiments, the loading of the first mask 105-1 takes about 20 to 50 seconds. In some embodiments, the loading of the first mask 105-1 takes about 40 seconds.

Figure 5M:
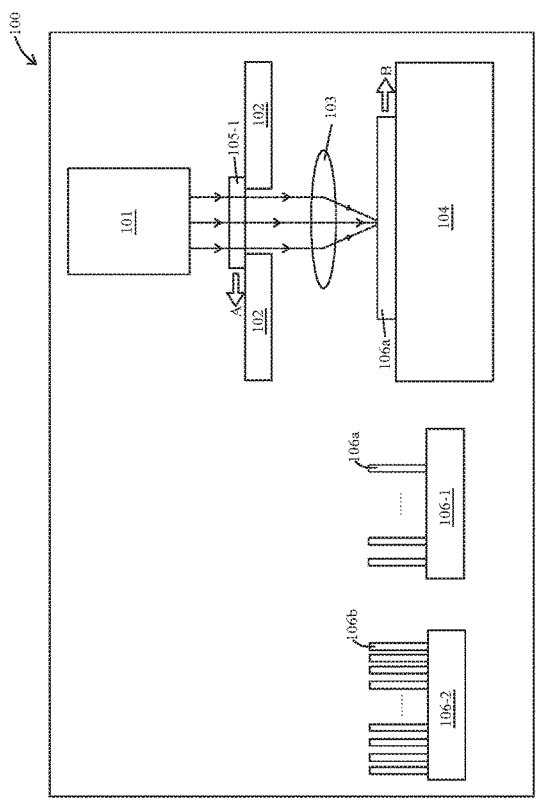
Figure 5N:
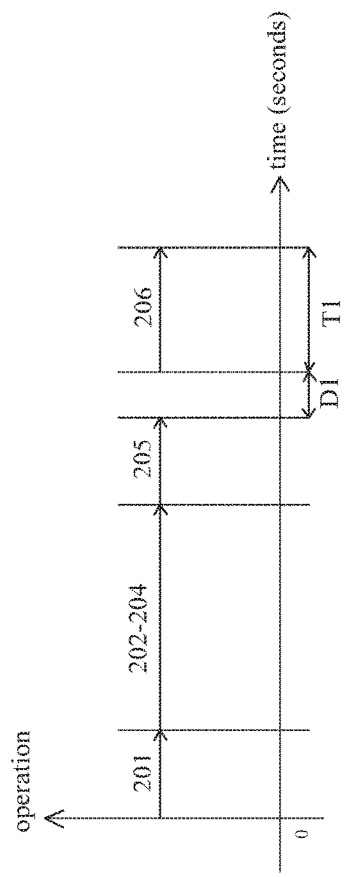

In operation 206, the first lot 106-1 is processed on a wafer stage 104 of the lithographic apparatus 100 as shown in FIGS. 5M and 5N. In some embodiments as shown in FIG. 5N, the processing of the first lot 106-1 begins a first duration D1 after the loading of the first mask 105-1 (the operation 205). In some embodiments, the operation 205 and the operation 206 are apart from about the first duration D1. In some embodiments, the first duration D1 is derived from the first processing time T1 or the total number of the first wafers 106a in the first lot 106-1. In some embodiments, the first duration D1 is substantially greater than or equal to zero second. In some embodiments, the operation 206 is performed immediately after the operation 205, and thus the first duration D1 equals zero second.

In some embodiments as shown in FIG. 5N, the first mask 105-1 is heated for a certain period of time before the processing of the first lot 106-1 (the operation 206). In some embodiments, the first mask 105-1 is heated for the first duration D1 after the first mask 105-1 is loaded on the mask stage 102 (the operation 205) and before the processing of the first lot 106-1 (the operation 206). In some embodiments, the first mask 105-1 is heated to a predetermined temperature. In some embodiments, the first mask 105-1 is heated by projecting a radiation beam from an illuminator 101 of the lithographic apparatus 100 through the first mask 105-1.

In some embodiments, a lens 103 is disposed between the mask stage 102 and the wafer stage 104. In some embodiments, the lens 103 of the lithographic apparatus 100 is configured to focus the radiation beam from the illuminator 101 and reduce the predetermined circuitry pattern of the first mask 105-1 on the first wafer 106a. In some embodiments, the lens 103 is heated for a certain period of time before the processing of the first lot 106-1 (the operation 206). In some embodiments, the lens 103 is heated for the first duration D1. In some embodiments, the lens 103 is heated to a predetermined temperature. In some embodiments, the lens 103 is heated by projecting a radiation beam from the illuminator 101 through the lens 103. In some embodiments, a quality of processing the first lot 106-1 is improved if the temperature of the first mask 105-1 or the lens 103 is controlled before the processing of the first lot 106-1.

In some embodiments as shown in FIGS. 5M and 5N, the processing of the first lot 106-1 is performed for the first processing time T1. In some embodiments, the operation 206 begins when a first wafer of the first lot 106-1 is loaded on the wafer stage 104, and the operation 206 accomplishes when a last wafer of the first lot 106-1 is processed and removed from the wafer stage 104. In some embodiments, during the first processing time T1, the first wafers 106a are loaded to the wafer stage 104 one by one, and a radiation beam from the illuminator 101 is projected through the first mask 105-1 towards the first wafers 106a one by one. In some embodiments, during the first processing time T1, the first wafer of the first lot 106-1 is loaded and processed on the wafer stage 104, and then the first wafer of the first lot 106-1 is removed from the wafer stage 104, and the last wafer of the first lot 106-1 is loaded and processed on the wafer stage 104, and then the last wafer of the first lot 106-1 is removed from the wafer stage 104. As such, a predetermined circuitry pattern of the first mask 105-1 is patterned on each of the first wafers 106a.

In some embodiments, during the operation 206, the first mask 105-1 is displaced along a direction A, one of the first wafers 106a is displaced along a direction B, and the radiation beam is projected through the first mask 105-1 and the lens 103 towards the one of the first wafers 106a.

Figure 5O:
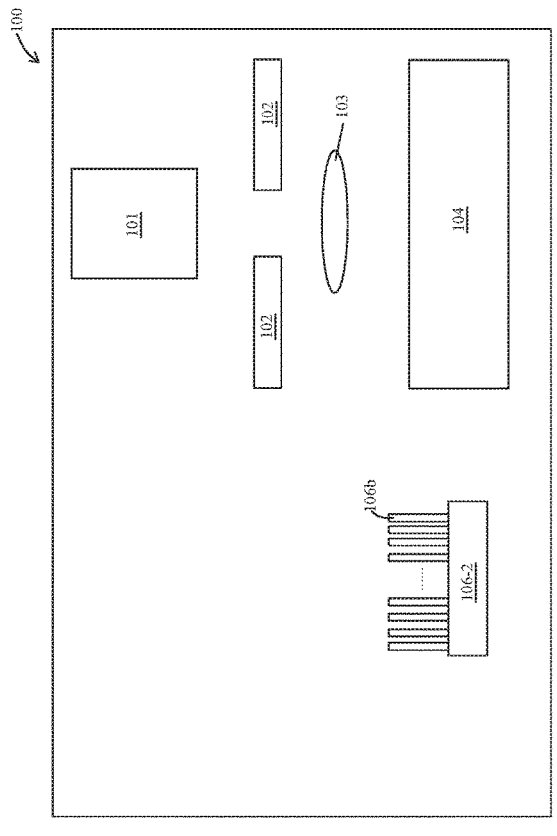
Figure 5P:
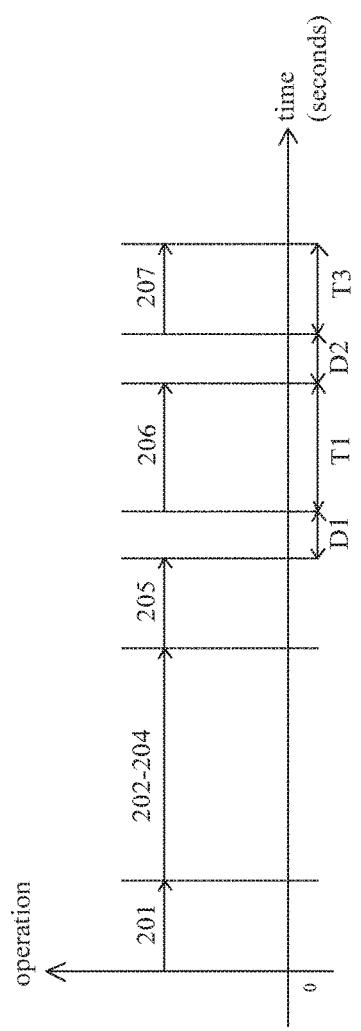

In operation 207, the first mask 105-1 is removed from the mask stage 102 as shown in FIGS. 5O and 5P. In some embodiments as shown in FIG. 5O, the first mask 105-1 is removed from the mask stage 102 back to the mask rack by the mask loader. In some embodiments, the first mask 105-1 is removed from the mask stage 102 after the processing of the first lot 106-1 (the operation 206) and before processing of the second lot 106-2 (subsequent operation 209).

In some embodiments as shown in FIG. 5P, the removal of the first mask 105-1 takes about a certain period of time. In some embodiments, the removal of the first mask 105-1 takes about a third processing time T3. In some embodiments, the third processing time T3 is about 20 to 50 seconds. In some embodiments, the third processing time T3 is about 40 seconds.

In some embodiments as shown in FIG. 5P, the removal of the first mask 105-1 begins a second duration D2 after the processing of the first lot 106-1 (the operation 206). In some embodiments, the second duration D2 is between the processing of the first lot 106-1 (the operation 206) and the removing of the first mask 105-1 from the mask stage 102 (the operation 207). In some embodiments, the second duration D2 is between the removing of the last wafer of the first lot 106-1 from the wafer stage 104 and the removing of the first mask 207. In some embodiments, the operation 207 is performed within the time interval I. In some embodiments, the operation 206 and the operation 207 are apart from about the second duration D2. In some embodiments, the second duration D2 is determined before the processing of the first lot 106-1 (the operation 206). In some embodiments, the second duration D2 is determined by the processing time difference (T1−T2 or T2−T1) or the time interval I. In some embodiments, the second duration D2 is substantially greater than or equal to zero second. In some embodiments, the operation 207 is performed immediately after the operation 206, and thus the second duration D2 equals zero second.

In some embodiments as shown in FIGS. 5O and 5P, the lens 103 is cooled down for a certain period of time. In some embodiments, the lens 103 is cooled down during the second duration D2 or the third processing time T3. In some embodiments, the illuminator 101 stops projecting a radiation beam to cool down the lens 103. In some embodiments, the lens 103 cools down to a predetermined temperature.

Figure 5Q:
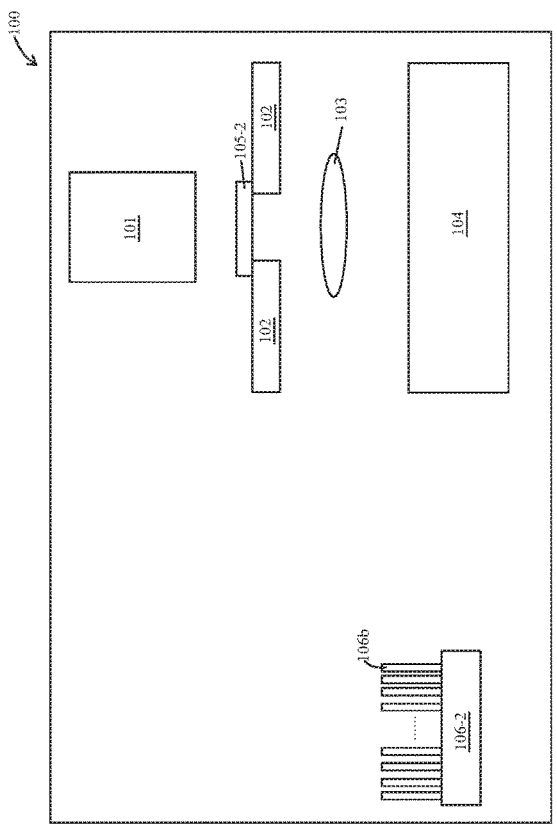
Figure 5R:
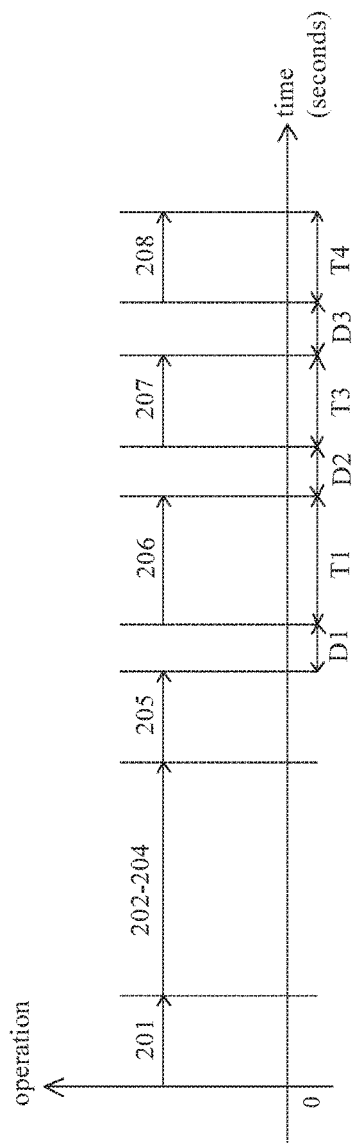

In operation 208, a second mask 105-2 is loaded on the mask stage 102 of the lithographic apparatus 100 as shown in FIGS. 5Q and 5R. In some embodiments as shown in FIG. 5Q, the second mask 105-2 is loaded to the mask stage 102 by a mask loader. In some embodiments, the mask loader loads the second mask 105-2 from a mask rack to the mask stage 102. In some embodiments, the second mask 105-2 is configured to impart a radiation beam in a predetermined pattern and generate the predetermined pattern on the second wafer 106-2 coated with a radiation sensitive material. In some embodiments, the second mask 105-2 has different predetermined circuitry pattern from the first mask 105-1.

In some embodiments as shown in FIG. 5R, the operation 208 is performed for a certain period of time. In some embodiments, the loading of the second mask 105-2 takes about a fourth processing time T4. In some embodiments, the fourth processing time T4 is about 20 to 50 seconds. In some embodiments, the fourth processing time T4 is about 40 seconds. In some embodiments, the loading of the second mask 105-2 is performed after the processing of the first lot 106-1 (the operation 205) and before processing of the second lot 106-2 (subsequent operation 209).

In some embodiments as shown in FIG. 5R, the loading of the second mask 105-2 begins a third duration D3 after the removal of the first mask 105-1 (the operation 207). In some embodiments, the third duration D3 is between the removal of the first mask 105-1 (the operation 207) and the loading of the second mask 105-2 (the operation 208). In some embodiments, the operation 207 and the operation 208 are apart from about the third duration D3. In some embodiments, the third duration D3 is determined before the processing of the first lot 106-1 (the operation 206). In some embodiments, the third duration D3 is determined by the processing time difference (T1–T2 or T2–T1) or the time interval I. In some embodiments, the third duration D3 is substantially greater than or equal to zero second. In some embodiments, the operation 208 is performed immediately after the operation 207, and thus the third duration D3 equals zero second.

In some embodiments as shown in FIGS. 5Q and 5R, the lens 103 is cooled down for a certain period of time. In some embodiments, the lens 103 is cooled down during the third duration D3 or the fourth processing time T4. In some embodiments, the illuminator 101 stops projecting a radiation beam to cool down the lens 103. In some embodiments, the lens 103 cools down to a predetermined temperature.

Figure 5S:
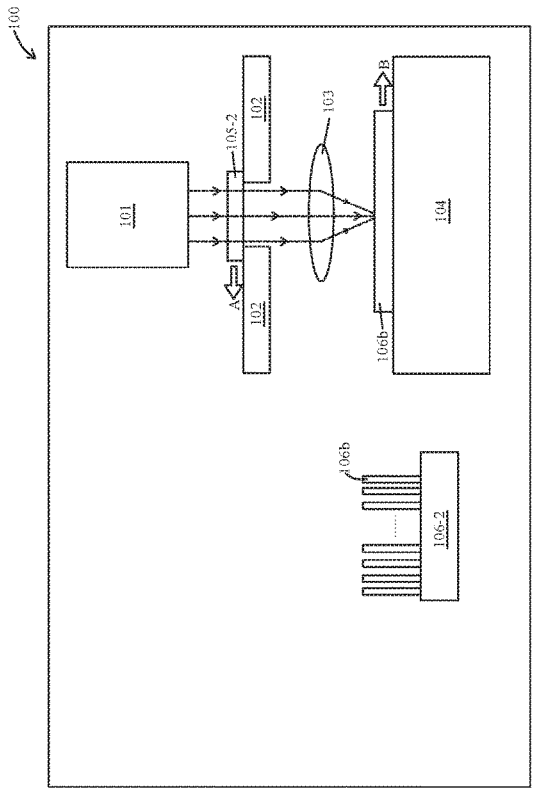
Figure 5T:
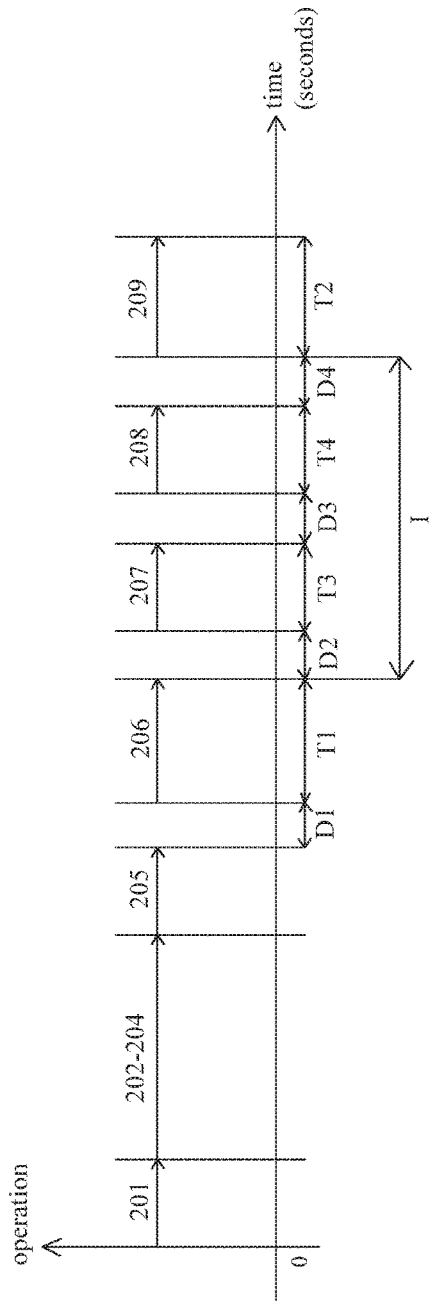

In operation 209, the second lot 106-2 is processed on the wafer stage 104 as shown in FIGS. 5S and 5T. In some embodiments as shown in FIG. 5T, the processing of the second lot 106-2 begins a fourth duration D4 after the loading of the second mask 105-2 (the operation 208). In some embodiments, the operation 208 and the operation 209 are apart from about the fourth duration D4. In some embodiments, the fourth duration D4 is between the loading of the second mask 105-2 (the operation 208) and loading of a first wafer of the second lot 106-2. In some embodiments, the fourth duration D4 is derived from the processing time difference (T1–T2 or T2–T1), the second processing time T2, the time interval I or the total number of second wafers 106b in the second lot 106-2. In some embodiments, the fourth duration D4 is determined before the processing of the second lot 106-2 (the operation 209). In some embodiments, the fourth duration D4 is substantially greater than or equal to zero second. In some embodiments, the operation 209 is performed immediately after the operation 205, and thus the fourth duration D4 equals zero second.

In some embodiments, the second mask 105-2 is heated for a certain period of time after the second mask 105-2 is loaded on the mask stage 102 (the operation 208). In some embodiments, the second mask 105-2 is heated for the fourth duration D4 after the loading of the second mask 105-2 (the operation 208) and before the processing of the second lot 106-2. In some embodiments, the second mask 105-2 is heated to a predetermined temperature. In some embodiments, the second mask 105-1 is heated by projecting a radiation beam from an illuminator 101 of the lithographic apparatus 100 through the second mask 105-2.

In some embodiments, the lens 103 is heated for a certain period of time. In some embodiments, the lens 103 is heated for the fourth duration D4. In some embodiments, the lens 103 is heated to a predetermined temperature. In some embodiments, the lens 103 is heated by projecting a radiation beam from the illuminator 101 through the lens 103. In some embodiments, a quality of processing the second lot 106-2 is improved if the temperature of the second mask 105-2 or the lens 103 is controlled before the processing of the second lot 106-2. In some embodiments, the lens 103 is heated after the removal of the first mask 105-1 and before the processing of the second lot 106-2.

In some embodiments as shown in FIGS. 5S and 5T, the processing of the second lot 106-2 is performed for the second processing time T2. In some embodiments, the processing of the second lot 106-2 begins when a first wafer of the second lot 106-2 is loaded on the wafer stage 104, and the processing of the second lot 106-2 accomplishes when a last wafer of the second lot 106-2 is processed and removed from the wafer stage 104. In some embodiments, during the second processing time T2, the second wafers 106b are loaded to the wafer stage 104 one by one, and a radiation beam from the illuminator 101 is projected through the second mask 105-2 towards the second wafers 106b one by one. In some embodiments, during the second processing time T2, the first wafer of the second lot 106-2 is loaded and processed on the wafer stage 104, and then the first wafer of the second lot 106-2 is removed from the wafer stage 104, and the last wafer of the second lot 106-2 is loaded and processed on the wafer stage 104, and then the last wafer of the second lot 106-2 is removed from the wafer stage 104. As such, a predetermined circuitry pattern of the second mask 105-2 is patterned on each of the second wafers 106b.

In some embodiments, during the operation 209, the second mask 105-2 is displaced along the direction A, one of the second wafers 106b is displaced along the direction B, and the radiation beam is projected through the second mask 105-2 and the lens 103 towards the one of the second wafers 106b.

Figure 5U:
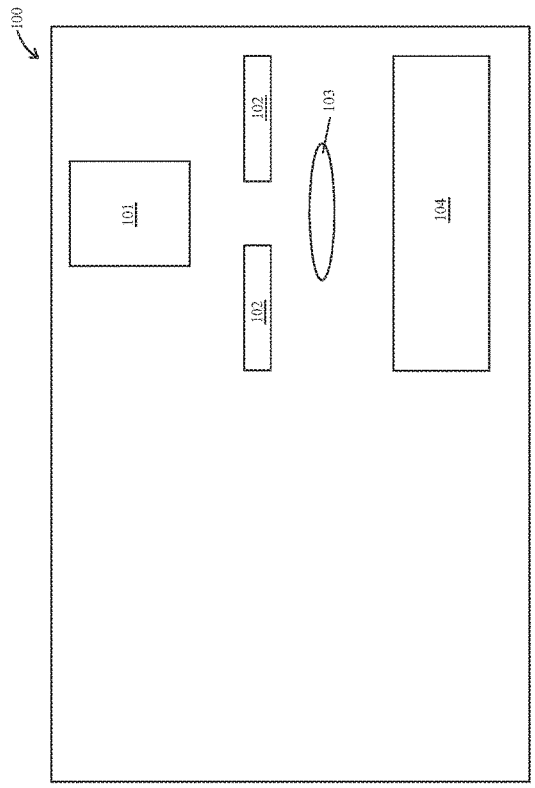
Figure 5V:
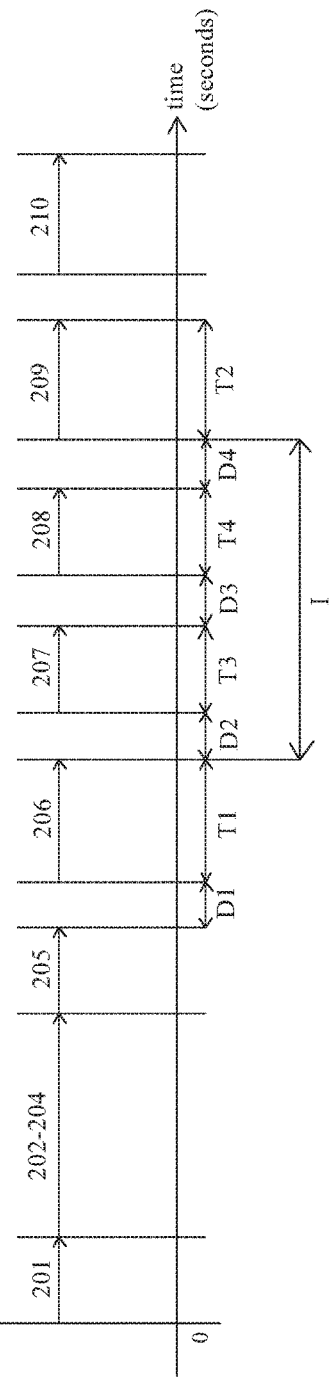

In operation 210, the second mask 105-2 is removed from the mask stage 105 as shown in FIGS. 5U and 5V. In some embodiments as shown in FIG. 5U, the second mask 105-2 is removed from the mask stage 102 back to the mask rack by the mask loader. In some embodiments, the second mask 105-2 is removed from the mask stage 102 after the processing of the second lot 106-2 (subsequent operation 209). In some embodiments as shown in FIG. 5V, the operation 210 is performed for a certain period of time. In some embodiments, the removal of the second mask 105-2 takes about 20 to 50 seconds. In some embodiments, the removal of the second mask 105-2 takes about 40 seconds.

A method of manufacturing a semiconductor structure is disclosed. The method includes deriving a processing time difference between processing a first lot and processing a second lot before processing the first lot and the second lot. As such, the removal of a first mask from a mask stage, loading of a second mask on the mask stage and loading of the second lot are correlated to lot size difference between the first lot and the second lot. Thus, the removal of the first mask, the loading of the second mask and the loading of the second lot can be timely performed. A delay of the loading of the second mask and immature loading of the second lot can be prevented or minimized. Furthermore, heating or cooling of the first mask, the second mask and a lens disposed between the mask stage and the wafer stage are correlated to the processing time difference, and thus temperatures of the first mask, the second mask and a lens disposed between the mask stage and the wafer stage are controlled. Therefore, a quality of the processing of the first lot and the second lot can be increased or improved.

In some embodiments, a method of manufacturing a semiconductor structure includes providing a first lot including a plurality of first wafers and a second lot including a plurality of second wafers; deriving a first processing time for processing the first lot; deriving a second processing time for processing the second lot; deriving a processing time difference between the first processing time and the second processing time; loading a first mask on a mask stage; processing the first lot on a wafer stage; removing the first mask from the mask stage; loading a second mask on the mask stage; and processing the second lot on the wafer stage, wherein a time interval between accomplishment of the processing of the first lot and beginning of the processing of the second lot is substantially greater than or equal to the processing time difference.

In some embodiments, the first processing time is derived from a total number of the plurality of first wafers, or the second processing time is derived from a total number of the plurality of second wafers. In some embodiments, the first processing time is substantially shorter than the second processing time. In some embodiments, a total number of the plurality of first wafers is substantially less than a total number of the plurality of second wafers. In some embodiments, the deriving of the processing time difference is performed before the processing of the first lot, the loading of the second mask or the processing of the second lot. the removing of the first mask and the loading of the second mask are performed within the time interval. In some embodiments, the removing of the first mask and the loading of the second mask are performed after the processing of the first lot and before the processing of the second lot. In some embodiments, the processing of the first lot includes loading the plurality of first wafers one by one on the wafer stage and projecting a radiation beam through the first mask towards the plurality of first wafers one by one. In some embodiments, the processing of the second lot includes loading the plurality of second wafers one by one on the wafer stage and projecting a radiation beam through the second mask towards the plurality of second wafers one by one. In some embodiments, the method further includes deriving a first duration of heating the second mask from the time interval; and heating the second mask for the first duration after the loading of the second mask and before the processing of the second lot. In some embodiments, the method further includes providing a lens disposed between the mask stage and the wafer stage; deriving a second duration of heating the lens from the time interval; and heating the lens for the second duration after the processing of the first lot and before the processing of the second lot.

In some embodiments, a method of manufacturing a semiconductor structure includes providing a first lot including a plurality of first wafers and a second lot including a plurality of second wafers; deriving a first time interval between loading of a last wafer of the first lot and loading a first wafer of the second lot; loading a first mask on a mask stage; processing a first wafer of the first lot on a wafer stage; removing the first wafer of the first lot from the wafer stage; processing the last wafer of the first lot on the wafer stage; removing the last wafer of the first lot from the wafer stage; removing the first mask from the mask stage; loading a second mask on the mask stage; processing the first wafer of the second lot on the wafer stage; removing the first wafer of the second lot from the wafer stage; processing a last wafer of the second lot on the wafer stage; removing the last wafer of the second lot from the wafer stage; and removing the second mask from the mask stage, wherein the removing of the last wafer of the first lot is apart from the processing of the first wafer of the second lot for about the first time interval.

In some embodiments, the first time interval is derived from a difference between a total number of the plurality of first wafers and a total number of the plurality of second wafers. In some embodiments, the removing of the first mask and the loading of the second mask are performed within the first time interval. In some embodiments, the first time interval is about 30 seconds to about 100 seconds. In some embodiments, a second time interval between the removing of the last wafer of the first lot and the removing of the first mask, a third time interval between the removing of the first mask and the loading of the second mask and a fourth time interval between the loading of the second mask and the loading of the first wafer of the second lot are determined from the first time interval. In some embodiments, the second time interval, the third time interval and the fourth time interval are substantially greater than or equal to 0 second respectively.

In some embodiments, a method of manufacturing a semiconductor structure includes loading a first lot including a plurality of first wafers and a second lot including a plurality of second wafers into an apparatus; deriving a processing time difference between processing the first lot and processing the second lot; determining a first time interval between the processing of the first lot and removing of a first mask from a mask stage of the apparatus; determining a second time interval between the removing of the first mask and loading of a second mask on the mask stage; determining a third time interval between the loading of the second mask and the processing of the second lot; loading the first mask on the mask stage; processing the first lot on a wafer stage of the apparatus; removing the first mask from the mask stage; loading the second mask on the mask stage; and processing the second lot on the wafer stage, wherein the first time interval, the second time interval and the third time interval are determined by the processing time difference.

In some embodiments, the second mask is heated for about the third time interval. In some embodiments, the processing of the second lot includes loading a first wafer of the second lot on the wafer stage after the loading of the second mask on the mask stage.

The foregoing outlines features of several embodiments so that those skilled in the art may better understand the aspects of the present disclosure. Those skilled in the art should appreciate that they may readily use the present disclosure as a basis for designing or modifying other processes and structures for carrying out the same purposes and/or achieving the same advantages of the embodiments introduced herein. Those skilled in the art should also realize that such equivalent constructions do not depart from the spirit and scope of the present disclosure, and that they may make various changes, substitutions, and alterations herein without departing from the spirit and scope of the present disclosure.

The invention claimed is:

1. A method of manufacturing a semiconductor structure, comprising:
   providing a first lot including a plurality of first wafers and a second lot including a plurality of second wafers;
   deriving a first processing time for processing the first lot;
   deriving a second processing time for processing the second lot;
   deriving a processing time difference between the first processing time and the second processing time;
   loading a first mask on a mask stage;
   processing the first lot on a wafer stage;
   removing the first mask from the mask stage;
   loading a second mask on the mask stage; and
   processing the second lot on the wafer stage,
   wherein a time interval between accomplishment of the processing of the first lot and beginning of the processing of the second lot is substantially greater than or equal to the processing time difference.

2. The method of claim 1, wherein the first processing time is derived from a total number of the plurality of first wafers, or the second processing time is derived from a total number of the plurality of second wafers.

3. The method of claim 1, wherein the first processing time is substantially shorter than the second processing time.

4. The method of claim 1, wherein a total number of the plurality of first wafers is substantially less than a total number of the plurality of second wafers.

5. The method of claim 1, wherein the deriving of the processing time difference is performed before the processing of the first lot, the loading of the second mask or the processing of the second lot.

6. The method of claim 1, wherein the removing of the first mask and the loading of the second mask are performed within the time interval.

7. The method of claim 1, wherein the removing of the first mask and the loading of the second mask are performed after the processing of the first lot and before the processing of the second lot.

8. The method of claim 1, wherein the processing of the first lot includes loading the plurality of first wafers one by one on the wafer stage and projecting a radiation beam through the first mask towards the plurality of first wafers one by one.

9. The method of claim 1, wherein the processing of the second lot includes loading the plurality of second wafers one by one on the wafer stage and projecting a radiation beam through the second mask towards the plurality of second wafers one by one.

10. The method of claim 1, further comprising:
deriving a first duration of heating the second mask from the time interval; and
heating the second mask for the first duration after the loading of the second mask and before the processing of the second lot.

11. The method of claim 1, further comprising:
providing a lens disposed between the mask stage and the wafer stage;
deriving a second duration of heating the lens from the time interval; and
heating the lens for the second duration after the processing of the first lot and before the processing of the second lot.

12. A method of manufacturing a semiconductor structure, comprising:
providing a first lot including a plurality of first wafers and a second lot including a plurality of second wafers;
deriving a first time interval between loading of a last wafer of the first lot and loading a first wafer of the second lot;
loading a first mask on a mask stage;
processing a first wafer of the first lot on a wafer stage;
removing the first wafer of the first lot from the wafer stage;
processing the last wafer of the first lot on the wafer stage;
removing the last wafer of the first lot from the wafer stage;
removing the first mask from the mask stage;
loading a second mask on the mask stage;
processing the first wafer of the second lot on the wafer stage;
removing the first wafer of the second lot from the wafer stage;
processing a last wafer of the second lot on the wafer stage;
removing the last wafer of the second lot from the wafer stage; and
removing the second mask from the mask stage,
wherein the removing of the last wafer of the first lot is apart from the processing of the first wafer of the second lot for about the first time interval.

13. The method of claim 12, wherein the first time interval is derived from a difference between a total number of the plurality of first wafers and a total number of the plurality of second wafers.

14. The method of claim 12, wherein the removing of the first mask and the loading of the second mask are performed within the first time interval.

15. The method of claim 12, wherein the first time interval is about 30 seconds to about 100 seconds.

16. The method of claim 12, wherein a second time interval between the removing of the last wafer of the first lot and the removing of the first mask, a third time interval between the removing of the first mask and the loading of the second mask and a fourth time interval between the loading of the second mask and the loading of the first wafer of the second lot are determined from the first time interval.

17. The method of claim 16, wherein the second time interval, the third time interval and the fourth time interval are substantially greater than or equal to 0 second respectively.

18. A method of manufacturing a semiconductor structure, comprising:
loading a first lot including a plurality of first wafers and a second lot including a plurality of second wafers into an apparatus;
deriving a processing time difference between processing the first lot and processing the second lot;
determining a first time interval between the processing of the first lot and removing of a first mask from a mask stage of the apparatus;
determining a second time interval between the removing of the first mask and loading of a second mask on the mask stage;
determining a third time interval between the loading of the second mask and the processing of the second lot;
loading the first mask on the mask stage;
processing the first lot on a wafer stage of the apparatus;
removing the first mask from the mask stage;
loading the second mask on the mask stage; and
processing the second lot on the wafer stage,
wherein the first time interval, the second time interval and the third time interval are determined by the processing time difference.

19. The method of claim 18, wherein the second mask is heated for about the third time interval.

20. The method of claim 18, wherein the processing of the second lot includes loading a first wafer of the second lot on the wafer stage after the loading of the second mask on the mask stage.

* * * * *